(12) United States Patent
Venkatasubramanian et al.

(10) Patent No.: US 10,403,502 B2
(45) Date of Patent: Sep. 3, 2019

(54) BORON DOPED TUNGSTEN CARBIDE FOR HARDMASK APPLICATIONS

(71) Applicant: Applied Materials, Inc., Santa Clara, CA (US)

(72) Inventors: Eswaranand Venkatasubramanian, Santa Clara, CA (US); Abhijit Basu Mallick, Fremont, CA (US); Susmit Singha Roy, Mountain View, CA (US); Takehito Koshizawa, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/882,204

(22) Filed: Jan. 29, 2018

(65) Prior Publication Data

US 2018/0218902 A1 Aug. 2, 2018

Related U.S. Application Data

(60) Provisional application No. 62/453,288, filed on Feb. 1, 2017.

(51) Int. Cl.
*H01L 21/033* (2006.01)
*H01L 21/02* (2006.01)
(Continued)

(52) U.S. Cl.
CPC ...... *H01L 21/0332* (2013.01); *C23C 16/0272* (2013.01); *C23C 16/32* (2013.01); *C23C 16/342* (2013.01); *C23C 16/345* (2013.01); *C23C 16/50* (2013.01); *C23C 16/505* (2013.01); *H01L 21/02175* (2013.01); *H01L 21/02205* (2013.01); *H01L 21/02274* (2013.01);
(Continued)

(58) Field of Classification Search
CPC ........... H01L 21/0332; H01L 21/31122; H01L 21/02175; H01L 21/02205; C23C 16/32
See application file for complete search history.

(56) References Cited

U.S. PATENT DOCUMENTS

| 5,821,169 A | 10/1998 | Nguyen et al. |
| 6,198,616 B1 | 3/2001 | Dahimene et al. |

(Continued)

OTHER PUBLICATIONS

International Search Report and Written Opinion for International Application No. PCT/US2018/013099 dated Apr. 27, 2018.

*Primary Examiner* — Joseph C. Nicely
(74) *Attorney, Agent, or Firm* — Patterson + Sheridan LLP

(57) ABSTRACT

Implementations of the present disclosure generally relate to the fabrication of integrated circuits. More particularly, the implementations described herein provide techniques for deposition of hardmask films on a substrate. In one implementation, a method of forming a hardmask layer on a substrate is provided. The method comprises forming a seed layer on a substrate by supplying a seed layer gas mixture in a processing chamber. The method further includes forming a transition layer comprising tungsten, boron and carbon on the seed layer by supplying a transition layer gas mixture in the processing chamber. The method further includes forming a bulk hardmask layer comprising tungsten, boron and carbon on the transition layer by supplying a main deposition gas mixture in the processing chamber.

20 Claims, 7 Drawing Sheets

(51) Int. Cl.
    *C23C 16/50*    (2006.01)
    *C23C 16/34*    (2006.01)
    *H01L 21/311*   (2006.01)
    *C23C 16/02*    (2006.01)
    *C23C 16/32*    (2006.01)
    *C23C 16/505*   (2006.01)

(52) U.S. Cl.
    CPC .. *H01L 21/02304* (2013.01); *H01L 21/31111* (2013.01); *H01L 21/31122* (2013.01); *H01L 21/31144* (2013.01)

(56) References Cited

U.S. PATENT DOCUMENTS

| | | |
|---|---|---|
| 7,220,673 B2 | 5/2007 | Xi et al. |
| 7,544,597 B2 | 6/2009 | Park et al. |
| 7,659,197 B1 | 2/2010 | Juliano |
| 8,053,365 B2 | 11/2011 | Humayun et al. |
| 8,110,493 B1 | 2/2012 | Subramonium et al. |
| 8,288,289 B2 | 10/2012 | Jeong et al. |
| 8,629,062 B2 | 1/2014 | Ha et al. |
| 9,040,421 B2 | 5/2015 | Zhang et al. |
| 9,536,734 B2 | 1/2017 | Hanashima et al. |
| 2002/0081861 A1 | 6/2002 | Robinson et al. |
| 2005/0199013 A1 | 9/2005 | Vandroux et al. |
| 2006/0024948 A1 | 2/2006 | Oh et al. |
| 2007/0026685 A1 | 2/2007 | Bae et al. |
| 2007/0072418 A1 | 3/2007 | Lee et al. |
| 2007/0148943 A1 | 6/2007 | Kim et al. |
| 2007/0231010 A1 | 10/2007 | Ohta et al. |
| 2009/0200672 A1 | 8/2009 | Kim et al. |
| 2010/0317177 A1 | 12/2010 | Huang et al. |
| 2012/0264306 A1 | 10/2012 | Wu et al. |
| 2014/0011358 A1 | 1/2014 | Chen et al. |
| 2014/0017897 A1 | 1/2014 | Seamons et al. |
| 2014/0154883 A1 | 6/2014 | Humayun et al. |
| 2015/0228474 A1 | 8/2015 | Hanashima et al. |
| 2015/0318294 A1 | 11/2015 | Wang |
| 2016/0027614 A1 | 1/2016 | Manna et al. |
| 2016/0035569 A1 | 2/2016 | Rumer et al. |
| 2016/0049323 A1 | 2/2016 | Ye et al. |
| 2016/0155627 A1 | 6/2016 | Hanashima et al. |
| 2017/0207087 A1* | 7/2017 | Roy .................. H01L 21/02175 |
| 2018/0076032 A1* | 3/2018 | Wang .................. C23C 16/342 |

* cited by examiner

BORON DOPED TUNGSTEN CARBIDE FOR HARDMASK APPLICATIONS

CROSS-REFERENCE TO RELATED APPLICATIONS

This application claims benefit of U.S. Provisional Patent Application Ser. No. 62/453,288, filed Feb. 1, 2017, which is incorporated herein by reference in its entirety.

BACKGROUND

Field

Implementations of the present disclosure generally relate to the fabrication of integrated circuits. More particularly, the implementations described herein provide techniques for deposition of hardmask films on a substrate.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is key to VLSI and ULSI success and to the continued effort to increase circuit density and quality of individual substrates and die.

Furthermore, the demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer. Thus, a highly selective etchant enhances accurate pattern transfer.

As the geometry limits of the structures used to form semiconductor devices are pushed against technology limits, the need for accurate pattern transfer for the manufacture of structures having small critical dimensions and high aspect ratios and structures with different materials has become increasingly difficult to satisfy. For example, the thickness of the energy sensitive resist has been reduced in order to control pattern resolution. Such thin resist layers (e.g., less than about 2000 Å) can be insufficient to mask underlying material layers during the pattern transfer process due to attack by the chemical etchant. An intermediate layer, called a hardmask ("HM") layer, is often used between the energy sensitive resist layer and the underlying material layers to facilitate pattern transfer because of its greater resistance to chemical etchants. Conventionally, silicon oxynitride, silicon carbine or carbon films are often the materials utilized for the hardmask layer.

During etching, the hardmask layer utilized to transfer patterns to the materials is exposed to aggressive etchants for a significant period. After a long period of exposure to the aggressive etchants, the hardmask layer without sufficient etching resistance may be dimensionally changed, resulting in inaccurate pattern transfer and loss of dimensional control. Furthermore, the similarity of the materials selected for the hardmask layer and the adjacent layers disposed in the film stack may result in similar etch properties therebetween, thus resulting in poor selectivity during etching. Poor selectivity between the hardmask layer and adjacent layers may result in non-uniform, tapered and deformed profile of the hardmask layer, thus leading to poor pattern transfer and failure of accurate structure dimension control.

Metal-doped films are being explored for hardmask applications owing to their high etch selectivity, which is helpful for the etching of deep structures. One of the main challenges for current metal-doped hardmask films is high film roughness and large grain size, which leads to poor local critical dimension uniformity ("CDU") post-etch and pattern etch issues. Current metal-doped hardmask films are also difficult to remove or strip from underlying films.

Thus, there is a need for improved hardmask films with high etch selectivity along with low grain size and roughness (smooth morphology) that is easily removed.

SUMMARY

Implementations of the present disclosure generally relate to the fabrication of integrated circuits. More particularly, the implementations described herein provide techniques for deposition of hardmask films on a substrate. In one implementation, a method of forming a hardmask layer on a substrate is provided. The method comprises forming a seed layer on a substrate by supplying a seed layer gas mixture in a processing chamber. The method further comprises forming a transition layer comprising tungsten, boron and carbon on the seed layer by supplying a transition layer gas mixture in the processing chamber. The method further comprises forming a bulk hardmask layer comprising tungsten, boron and carbon on the transition layer by supplying a main deposition gas mixture in the processing chamber.

In another implementation, a hardmask layer is provided. The hardmask layer comprises a seed layer, a transition layer and a bulk hardmask layer disposed on the transition layer. The seed layer is a boron carbide layer. The transition layer is a tungsten boron carbide layer. The bulk hardmask layer is a tungsten boron carbide layer.

In yet another implementation, a method of forming a hardmask layer is provided. The method comprises supplying a gas mixture including at least a boron-based precursor gas and a carbon-based precursor gas onto a surface of a substrate disposed in a processing chamber to form a seed layer on the substrate. The method further comprises ramping down the carbon-based precursor gas and ramping up a tungsten-based precursor gas supplied in the gas mixture while maintaining a steady flow of the boron-based precursor gas into the processing chamber to form a transition layer on the seed layer. The method further comprises continuously supplying the tungsten-based precursor gas in the gas mixture until the tungsten-based precursor gas reaches to a predetermined flow rate and maintaining the tungsten-based precursor gas at a steady predetermined flow rate to form a bulk hardmask layer.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
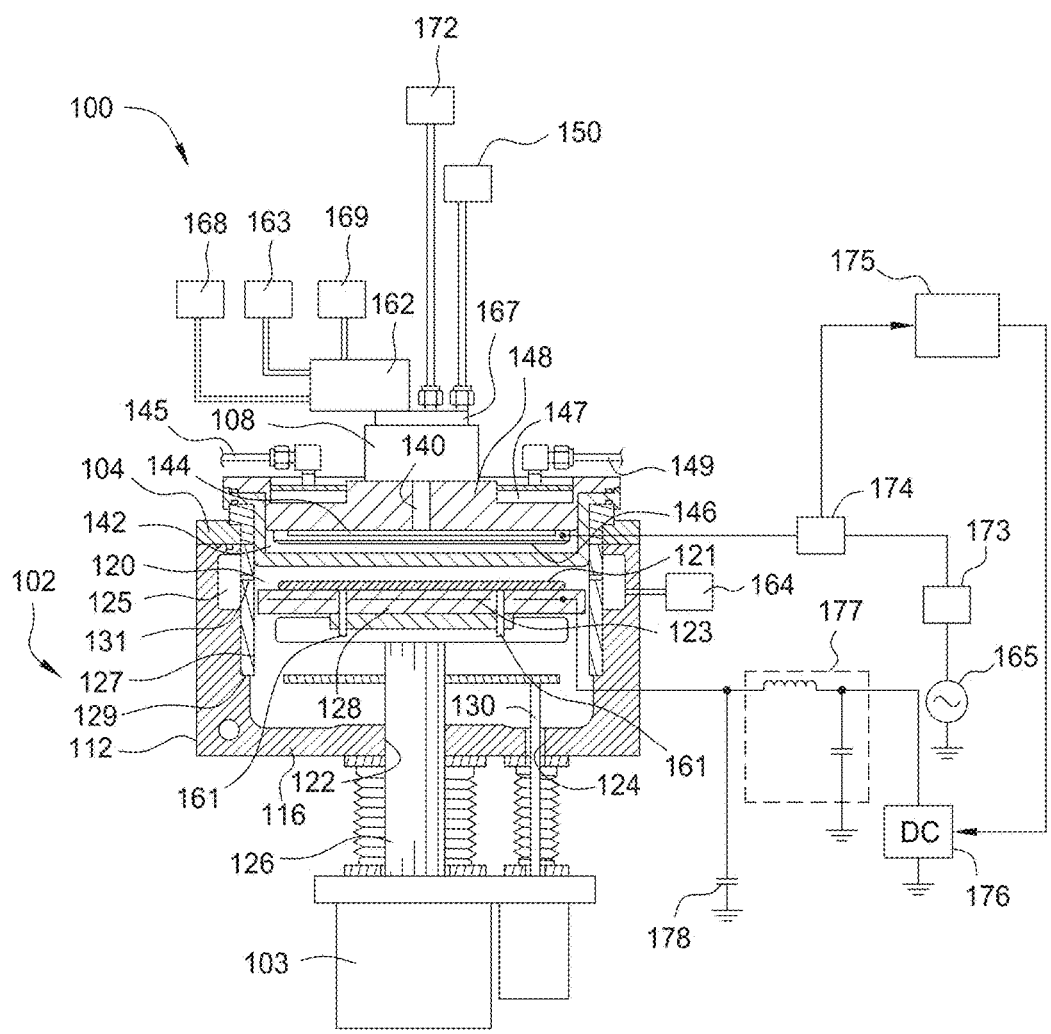
FIG. 1 depicts a schematic cross-sectional view of a PECVD system that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques for deposition of hardmask films on a substrate. Certain details are set forth in the following description and in FIGS. 1-7 to provide a thorough understanding of various implementations of the disclosure. Other details describing well-known structures and systems often associated with plasma processing, hardmask film deposition and etching are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a PECVD process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP PRECISION™ systems and PRODUCER® SE™ systems which are commercially available from Applied Materials, Inc., of Santa Clara, Calif. Other tools capable of performing PECVD processes may also be adapted to benefit from the implementations described herein. In addition, any system enabling the PECVD processes described herein can be used to advantage. The apparatus description described herein is illustrative and should not be construed or interpreted as limiting the scope of the implementations described herein.

Metal-doped films are currently being explored for hardmask (HM) applications because of the high etch selectivity that is essential for etching deep structures. One of the main challenges for metal-doped hardmask films is high roughness and large grain size, which leads to poor local CDU post-etch and pattern etch issues, the other issue being ease of removal or "stripability." Current hardmask film applications make use of carbon-based films that are amorphous in nature but their etch selectivity is no longer sufficient to meet the increasingly stringent requirements and the high-aspect ratio etch of the upcoming nodes. To achieve this, metal-based hardmasks are being explored as they provide the requisite high etch selectivity. However, metal-based hardmask films have their own issues, which include roughness and stripability. The issues of roughness and stripability are present irrespective of the deposition process used to fabricate the films. Hence, there is a need for films with high etch selectivity along, low grain size (smooth morphology) and high stripability.

Some implementations of the present disclosure provide a small grain, smooth tungsten boron carbide thin film, which may be used in hardmask applications. The quantity/percentage of tungsten in the as-deposited tungsten boron carbide hardmask film may vary from application to application. The atomic percentage of tungsten incorporation in the film is calculated as follows: $((W/(W+B+C))$ %). In various implementations of the present disclosure, the tungsten boron carbide hardmask film may contain at least 30, 35, 40, 45, 50, 55, 60, 65, 70, or 75 atomic percentage of tungsten. The tungsten boron carbide hardmask film may contain up to 35, 40, 45, 50, 55, 60, 65, 70, 75 or 80 atomic percentage of tungsten. The tungsten boron carbide hardmask film may contain from about 30 to about 80 atomic percentage of tungsten. The tungsten boron carbide hardmask film may contain from about 50 to about 70 atomic percentage of tungsten. The tungsten boron carbide hardmask film may contain from about 60 to about 70 atomic percentage of tungsten. The atomic percentage of carbon incorporation in the film is calculated as follows: $((C/(W+B+C))$ %). The tungsten boron carbide hardmask film may contain at least 10, 15, 20, 25, 30, 35, 40, 45, 50, 55, 60, or 65 atomic percentage of carbon. The tungsten boron carbide hardmask film may contain up to 15, 20, 25, 30, 35, 40, 45, 50, 55, 60, 65, or 70 atomic percentage of carbon. The tungsten boron carbide hardmask film may contain from about 10 to about 70 atomic percentage of carbon. The tungsten boron carbide hardmask film may contain from about 10 to about 30 atomic percentage of carbon. The tungsten boron carbide hardmask film may contain from about 20 to about 30 atomic percentage of carbon. The atomic percentage of boron incorporation in the film is calculated as follows: ((B/(W+B+C)) %). The tungsten boron carbide hardmask film may contain at least 2, 5, 10, 15, 20, or 25 atomic percentage of boron. The tungsten boron carbide hardmask film may contain up to 5, 10, 15, 20, 25 or 30 atomic percentage of boron. The tungsten boron carbide hardmask film may contain from about 2 to about 30 atomic percentage of hydrogen. The tungsten boron carbide hardmask film may contain from about 10 to about 20 atomic percentage of boron. In certain implementations where hydrogen is used as a precursor, the tungsten boron carbide hardmask film may contain at least 2, 5, 8, 10, or 15 atomic percentage of hydrogen. The tungsten boron carbide hardmask film may contain up to 5, 8, 10, 15 or 20 atomic percentage of hydrogen. The tungsten boron carbide hardmask film may contain from about 2 to about 15 atomic percentage of hydrogen. The tungsten boron carbide hardmask film may contain from about 5 to about 10 atomic percentage of hydrogen.

In some implementations described herein, the tungsten boron carbide hardmask film has an average grain size of 20 Å or less (e.g., 18 Å or less; 16 Å or less; 10 Å or less; between about 10 Å and 16 Å; or between about 5 Å and 16 Å). In some implementations described herein, the tungsten boron carbide hardmask film has a pattern etch selectivity of about 22 or less (e.g., 21 or less; 20 or less; 19 or less; or 15 or less).

FIG. 1 depicts a schematic illustration of a PECVD system 100 having an electrostatic chuck 128 that can be used for the practice of implementations described herein. It should be noted that although a PECVD system is described in this application, apparatus and method of the present disclosure may apply to any suitable plasma process using an electrostatic chuck. The PECVD system 100 generally comprises a chamber body 102 supporting a chamber lid 104, which may be attached to the chamber body 102 by a hinge. The chamber body 102 comprises sidewalls 112 and a bottom wall 116 defining a processing region 120. The chamber lid 104 may comprise one or more gas distribution system(s) 108 disposed therethrough for delivering reactant and cleaning gases into the processing region 120. A circumferential pumping channel 125 formed in the sidewalls 112 and coupled to a pumping system 164 is configured for exhausting gases from the processing region 120 and controlling the pressure within the processing region 120. Two passages 122 and 124 are formed in the bottom wall 116. A stem 126 of an electrostatic chuck passes through the passage 122. A rod 130 configured to activate substrate lift pins 161 passes through the passage 124.

A chamber liner 127 made of ceramic or the like is disposed in the processing region 120 to protect the sidewalls 112 from the corrosive processing environment. The chamber liner 127 may be supported by a ledge 129 formed in the sidewalls 112. A plurality of exhaust ports 131 may be formed on the chamber liner 127. The plurality of exhaust ports 131 is configured to connect the processing region 120 to the circumferential pumping channel 125.

The gas distribution system 108 is configured to deliver reactant and cleaning gases and is disposed through the chamber lid 104 to deliver gases into the processing region 120. The gas distribution system 108 includes a gas inlet passage 140, which delivers gas into a showerhead assembly 142. The showerhead assembly 142 is comprised of an annular base plate 148 having a blocker plate 144 disposed intermediate to a faceplate 146.

A cooling channel 147 is formed in the annular base plate 148 of the gas distribution system 108 to cool the annular base plate 148 during operation. A cooling inlet 145 delivers a coolant fluid, such as water or the like, into the cooling channel 147. The coolant fluid exits the cooling channel 147 through a coolant outlet 149.

The chamber lid 104 has matching passages to deliver gases from one or more gas inlets 163, 168, 169 through a remote plasma source 162 to a gas inlet manifold 167 positioned on top of the chamber lid 104. The PECVD system 100 may comprise one or more liquid delivery sources 150 and one or more gas sources 172 configured to provide a carrier gas and/or a precursor gas.

The electrostatic chuck 128 is configured for supporting and holding a substrate being processed. In one implementation, the electrostatic chuck 128 may comprise at least one electrode 123 to which a voltage is applied to electrostatically secure a substrate thereon. The electrode 123 is powered by a direct current (DC) power source 176 connected to the electrode 123 via a low pass filter 177. The electrostatic chuck 128 may be monopolar, bipolar, tripolar, DC, interdigitated, zonal and the like.

In one implementation, the electrostatic chuck 128 is movably disposed in the processing region 120 driven by a drive system 103 coupled to the stem 126. The electrostatic chuck 128 may comprise heating elements, for example resistive elements, to heat a substrate positioned thereon to a chosen process temperature. Alternatively, the electrostatic chuck 128 may be heated by an outside heating element such as a lamp assembly. The drive system 103 may include linear actuators, or a motor and reduction gearing assembly, to lower or raise the electrostatic chuck 128 within the processing region 120.

An RF source 165 is coupled to the showerhead assembly 142 through an impedance matching circuit 173. The faceplate 146 of the showerhead assembly 142 and the electrode 123, which may be grounded via a high pass filter, such as a capacitor 178, form a capacitive plasma generator. The RF source 165 provides RF energy to the showerhead assembly 142 to facilitate generation of a capacitive plasma between the faceplate 146 of the showerhead assembly 142 and the electrostatic chuck 128. Thus, the electrode 123 provides both a ground path for the RF source 165 and an electric bias from the DC power source 176 to enable electrostatic clamping of the substrate.

The RF source 165 may comprise a high frequency radio frequency (HFRF) power source, e.g., a 13.56 MHz RF generator, and/or a low frequency radio frequency (LFRF) power source, e.g., a 300-350 kHz RF generator. The LFRF power source provides both low frequency generation and fixed match elements. The HFRF power source is designed for use with a fixed match and regulates the power delivered to the load, eliminating concerns about forward and reflected power.

In certain embodiments, properties of a substrate secured on the electrostatic chuck 128 may be monitored during a plasma process. In certain embodiments, flatness of a substrate secured on the electrostatic chuck 128 may be monitored during a plasma process. In one embodiment, flatness of a substrate secured on the electrostatic chuck 128 may be monitored by measuring characteristics of the electrostatic chuck 128 with the substrate secured thereon. Characteristics of the electrostatic chuck 128 may be measured by a sensor 174 connected with the faceplate 146. The sensor 174 may be a VI probe connected between the faceplate 146 and the impedance matching circuit 173. In some embodiments, the sensor 174 may be configured to measure capacitance between the faceplate 146 and the electrode 123 since capacitance between the faceplate 146 and the electrode 123 is effected by the flatness of a substrate 121 positioned between the faceplate 146 and the electrode 123.

As shown in FIG. 1, the PECVD system 100 may further include a system controller 175. The system controller 175 may be configured to calculate and adjust the flatness of the substrate 121 being processed in the PECVD system 100. In one implementation, the system controller 175 may calculate flatness or chucking status of the substrate 121 by monitoring characteristics, such as imaginary impedance, of the electrostatic chuck 128. When measurement of the imaginary impedance indicates that the substrate 121 decreases in flatness, the system controller 175 may increase chucking power by adjusting the DC power source 176. In one implementation, decreased flatness of the substrate 121 may be indicated by negatively increased imaginary impedance of the electrostatic chuck 128.

Figure 2:
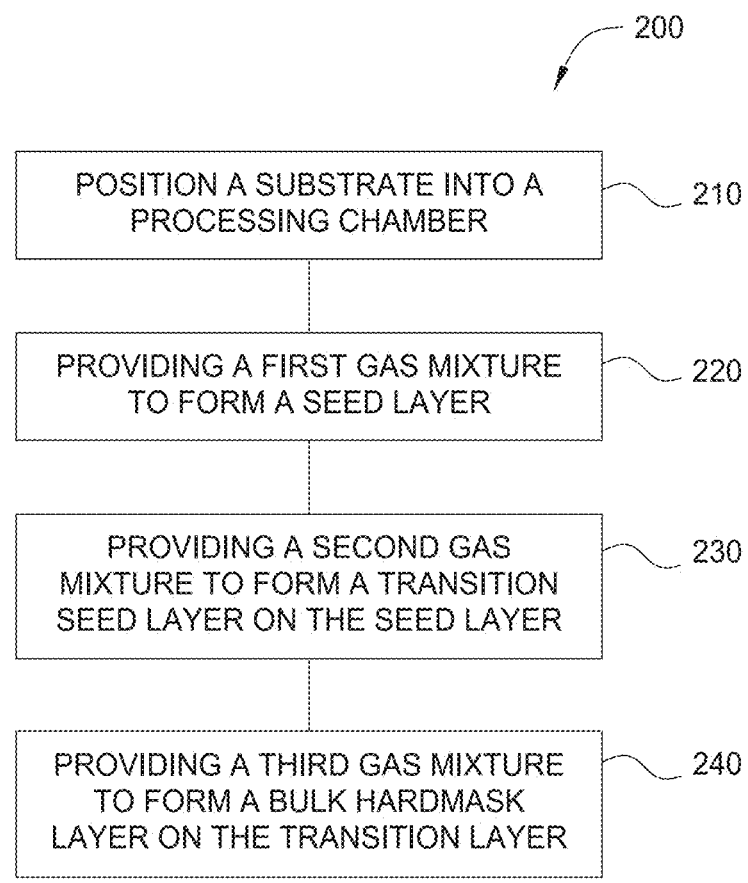
FIG. 2 depicts a flow diagram of a method for forming a tungsten boron carbide hardmask layer according to one or more implementations described herein.

FIG. 2 depicts a flow diagram of a method 200 for forming a tungsten boron carbide hardmask layer on a film stack disposed on a substrate in accordance with one implementation of the present disclosure. The hardmask layer formed on a film stack may be utilized, for example, to form stair-like structures in the film stack. FIGS. 3A-3D are schematic cross-sectional views illustrating a sequence for forming a hardmask layer on a film stack disposed on a substrate according to the method 200. FIG. 4 depicts a gas flow diagram 400 for forming a tungsten boron carbide hardmask layer in accordance with various implementations of the present disclosure.

Referencing FIG. 4, a seed layer (e.g., seed layer 310) is formed during time "zone 1" (operation 220), a transition layer (e.g., transition layer 311) is formed during time "zone 2" (operation 230), and a bulk hardmask layer (e.g., bulk hardmask layer 312) is formed on the transition layer during time "zone 3" (operation 240). As shown in FIG. 4, the boron-based precursor gas is represented by trace line $G_1$. The carbon-based precursor gas is represented by trace line $G_2$. The tungsten-based precursor gas is represented by trace line $G_3$. Hydrogen gas is represented by trace line $G_4$. Inert gases (argon and helium) are represented by trace line $G_5$. High frequency radio frequency (HFRF) is represented by trace line $G_6$.

Although the method 200 is described below with reference to a hardmask layer that may be formed on a film stack utilized to manufacture stair-like structures in the film stack for three dimensional semiconductor devices, the method 200 may also be used to advantage in other device manufacturing applications. The time intervals for the operations described in method 200 ($T_1$, $T_2$, $T_3$, etc.) can be of the same length ($T_1=T_2=T_3=T_4=\ldots$), different lengths for gas-on and gas-off ($T_1=T_3=T_5=\ldots=T_{(odd)}$, $T_2=T_4=T_6=\ldots=T_{(even)}$, and $T_{(odd)}>$ or $<T_{(even)}$), or other different lengths, including gradual increase/decrease and random. In some implementations, the time interval ranges from 0.1 seconds to 150 seconds.

Figure 3A:
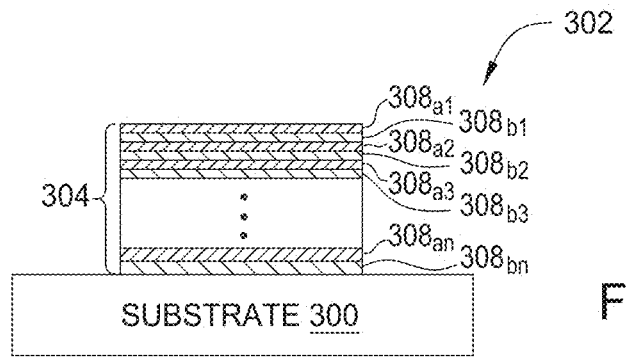
FIGS. 3A-3D depicts a sequence for forming a tungsten boron carbide hardmask layer on a film stack in accordance with one or more implementations described herein.
Figure 4:
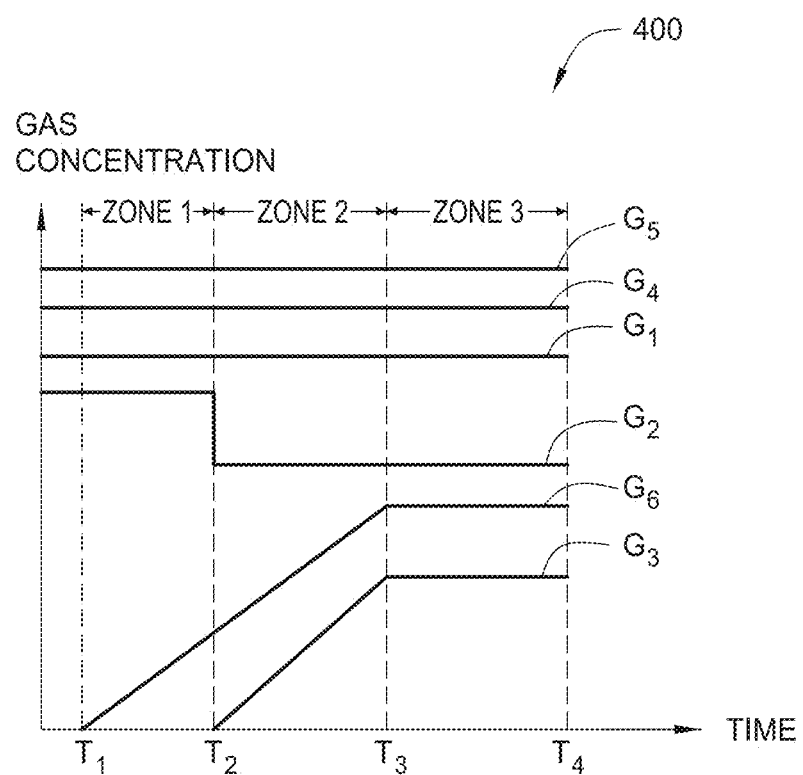
FIG. 4 depicts a gas flow diagram for forming a tungsten boron carbide hardmask layer in accordance with one or more implementations described herein.

The method 200 begins at operation 210 by positioning a substrate, such as substrate 300 depicted in FIG. 3A, into a processing chamber, such as the processing chamber of the PECVD system 100 depicted in FIG. 1. The substrate 300 may be positioned on an electrostatic chuck, for example, electrostatic chuck 128. The substrate 300 may be a silicon-based material or any suitable insulating material or conductive material as needed, having a film stack 304 disposed on the substrate 300 that may be utilized to form a structure 302, such as stair-like structures, in the film stack 304.

As shown in the exemplary implementation depicted in FIG. 3A, the substrate 300 may have a substantially planar surface, an uneven surface, or a substantially planar surface having a structure formed thereon. The film stack 304 is formed on the substrate 300. In one implementation, the film stack 304 may be utilized to form a gate structure, a contact structure or an interconnection structure in a front end or back end process. The method 200 may be performed on the film stack 304 to form the stair-like structures therein used in a memory structure, such as NAND structure. In one implementation, the substrate 300 may be a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 300 may have various dimensions, such as 200 mm, 300 mm, and 450 mm or other diameter substrates, as well as, rectangular or square panels. Unless otherwise noted, implementations and examples described herein are conducted on substrates with a 200 mm diameter, a 300 mm diameter, or a 450 mm diameter substrate. In the implementation wherein a SOI structure is utilized for the substrate 300, the substrate 300 may include a buried dielectric layer disposed on a silicon crystalline substrate. In the implementation depicted herein, the substrate 300 may be a crystalline silicon substrate.

In one implementation, the film stack 304 disposed on the substrate 300 may have a number of vertically stacked layers. The film stack 304 may comprise pairs including a first layer (shown as $308a_1$, $308a_2$, $308a_3$, ..., $308a_n$) and a second layer (shown as $308b_1$, $308b_2$, $308b_3$, ..., $308b_n$) repeatedly formed in the film stack 304. The pairs includes alternating first layer (shown as $308a_1$, $308a_2$, $308a_3$, ..., $308a_n$) and second layer (shown as $308b_1$, $308b_2$, $308b_3$, ..., $308b_n$) repeatedly formed until the chosen numbers of pairs of the first layers and the second layers are reached.

Figure 3B:
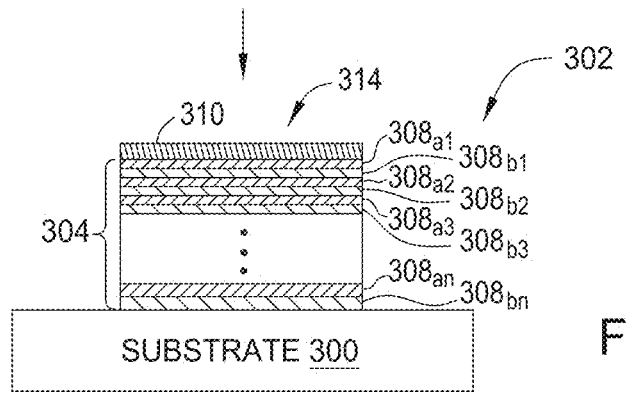
Figure 3C:
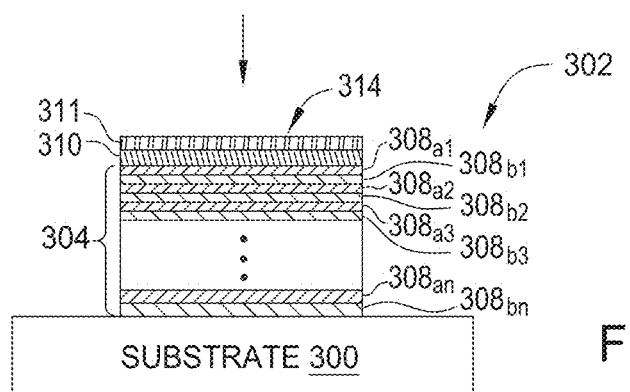

The film stack 304 may be a part of a semiconductor chip, such as a three-dimensional memory chip. Although three repeating layers of first layers (shown as $308a_1$, $308a_2$, $308a_3$, ..., $308a_n$) and second layers (shown as $308b_1$, $308b_2$, $308b_3$, ..., $308b_n$) are shown in FIGS. 3A-3C, it is noted that any number of repeating pairs of the first and the second layers may be utilized as needed.

In one implementation, the film stack 304 may be utilized to form multiple gate structures for a three-dimensional memory chip. The first layers $308a_1$, $308a_2$, $308a_3$, ..., $308a_n$, formed in the film stack 304 may be a first dielectric layer and the second layers $308b_1$, $308b_2$, $308b_3$, ..., $308b_n$ may be a second dielectric layer. Suitable dielectric layers may be utilized to form the first layers $308a_1$, $308a_2$, $308a_3$, ..., $308a_n$ and the second layer $308b_1$, $308b_2$, $308b_3$, ..., $308b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In some implementations, the dielectric layers may be a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

In one particular example, the first layers $308a_1$, $308a_2$, $308a_3$, ..., $308a_n$ are silicon oxide layers and the second layers $308b_1$, $308b_2$, $308b_3$, ..., $308b_n$ are silicon nitride layers or polysilicon layers disposed on the first layers $308a_1, 308a_2, 308a_3, \ldots, 308a_n$. In one implementation, the thickness of first layers $308a_1, 308a_2, 308a_3, \ldots, 308a_n$ may be controlled at between about 50 Å and about 1000 Å, such as about 500 Å, and the thickness of the each second layers $308b_1, 308b_2, 308b_3, \ldots, 308b_n$ may be controlled at between about 50 Å and about 1000 Å, such as about 500 Å. The film stack 304 may have a total thickness between about 100 Å and about 2000 Å. In one implementation, a total thickness of the film stack 304 is about 3 microns to about 10 microns and will vary as technology advances.

It is noted that the hardmask layer may be formed on any surfaces or any portion of the substrate 300 with or without the film stack 304 present on the substrate 300.

At operation 220, after the substrate 300 is transferred to the processing region, such as the processing region 120 of PECVD system 100 depicted in FIG. 1, a seed layer gas mixture is supplied into the PECVD system 100 to deposit a seed layer 310 on the film stack 304, as shown in FIG. 3B. The seed layer 310 may be any suitable seed layer. Examples of suitable seed layers include, but are not limited to, boron carbide (BC) seed layers, boron nitride (BN) seed layers, boron carbon nitride (BCN) seed layers, carbon nitride (CN) seed layers, silicon carbide (SiC) seed layers, silicon nitride (SiN) seed layers, boron-based seed layers, carbon seed layers, titanium nitride (TiN) seed layers, and tungsten silicide (WSi) seed layers. In one implementation, the seed layer 310 is formed by the processes depicted in "zone 1" of FIG. 4. In one implementation, the seed layer 310 is a boron carbide layer.

During deposition of the seed layer 310, the process parameters utilized to ignite and form the plasma in the gas mixture may be dynamically controlled or preset to a predetermined flow rate to facilitate depositing the seed layer 310 with sought after film properties and film microstructure. The seed layer gas mixture includes reactive precursor gases for depositing the aforementioned seed layers. Exemplary reactive precursor gases for depositing the seed layer include boron-based precursor gases, carbon-based precursor gases, nitrogen-based precursor gases, silicon-based precursor gases, titanium-based precursor gases and tungsten-based precursor gases.

Suitable boron-based precursor gases for forming the seed layer 310 include, but are not limited to, trimethylborane ($(B(CH_3)_3)$ or TMB), diborane ($B_2H_6$), boron trifluoride ($BF_3$), and triethylborane ($(B(C_2H_5)_3)$ or TEB) and combinations thereof. The boron-based precursor gas may be part of a boron-containing gas mixture. Exemplary boron-containing gas mixtures may include 5% $B_2H_6$/95% $N_2$, 5% $B_2H_6$/95% He, 10% $B_2H_6$/90% He, 5% $B_2H_6$/95% Ar, 10% $B_2H_6$/90% Ar, 5% $B_2H_6$/95% $H_2$, 10% $B_2H_6$/80% $H_2$, or 20% $B_2H_6$/80% $H_2$. It is contemplated that when different concentrations of boron-containing gas mixtures are used, the flow rate needed to achieve certain film properties may change accordingly.

Suitable carbon-based precursor gases for forming the seed layer include, but are not limited to, $CH_4$, $C_2H_2$, $C_3H_6$, $C_4H_8$, $C_5H_{10}$, and the like. Suitable nitrogen-based precursor gases for forming the seed layer include, but are not limited to, nitrogen gas ($N_2$), $NH_3$, $N_2O$, $NO_2$, NO, $N_2O_4$, and the like. Suitable silicon-containing precursor gases for forming the seed layer include silane-containing precursor gases, including, but not limited to silane ($SiH_4$), di-silane ($Si_2H_6$), higher order silanes, and the like. Suitable tungsten-containing precursor gases for forming the seed layer include, but are not limited to, $WF_6$, $WCl_6$, $W(CO)_6$, and the like. Suitable hydrogen-based precursor gases for forming the seed layer include, but are not limited to, $H_2$, $H_2O$, $H_2O_2$ and combinations thereof. Suitable inert gases for forming the seed layer include, but are not limited to, argon, helium, or combinations thereof.

In one implementation, the seed layer gas mixture includes a boron-based precursor gas, a carbon-based precursor gas, optionally a hydrogen-based precursor gas, and optionally inert gases. In one implementation, the boron-based precursor gas is diborane ($B_2H_6$), the carbon-based precursor gas is propene ($C_3H_6$), and the optional hydrogen-based precursor gas is $H_2$. In some examples, inert gas, such as Ar or He may also be optionally supplied in the seed layer gas mixture as needed.

It should be understood that the boron-based precursor gas and the carbon-based precursor gas used in the following description may be replaced with any of the nitrogen-based precursor gases, silicon-based precursor gases, and tungsten-based precursor gases depending upon the type of seed layer deposited. In some implementations where a boron nitride seed layer is formed, the carbon-based precursor gas would be replaced with a nitrogen-based precursor gas. In some implementations where a boron carbon nitride seed layer is formed, a nitrogen-based precursor gas is included with the boron-based precursor gas and the carbon-based precursor gas. In some implementations where a carbon nitride seed layer is formed, the boron-based precursor gas is replaced with a nitrogen-based precursor gas. In some implementations, where a silicon-carbide seed layer is formed, the boron-based precursor gas is replaced with a silicon-based precursor gas. In some implementations, where a tungsten silicide seed layer is formed, the boron-based precursor gas is replaced with a tungsten-based precursor gas and the carbon-based precursor gas is replaced with a silicon-based precursor gas.

In one implementation, the boron-based precursor gas supplied at operation 220 for forming the seed layer 310 is controlled at between about 100 sccm and about 5,000 sccm (e.g., between about 1,000 sccm and about 3,000 sccm; between about 2,000 sccm and about 2,500 sccm) for between 2 seconds and about 30 seconds. In one implementation, the carbon-based precursor gas flow supplied at operation 220 for forming the seed layer 310 is controlled at between 10 sccm and about 1,000 sccm (e.g., between about 20 sccm and about 100 sccm; between about 50 sccm and about 80 sccm) for between 2 seconds and about 30 seconds. Alternatively, the precursors supplied in the seed layer gas mixture may be controlled at a ratio of the carbon-based precursor to the boron-based precursor between about 1:10 and about 1:50. In one implementation, the hydrogen-based precursor gas flow supplied at operation 220 for forming the seed layer 310 is controlled at between 1,000 sccm and about 5,000 sccm (e.g., between about 2,000 sccm and about 4,000 sccm; between about 3,000 sccm and about 3,500 sccm) for between 2 seconds and about 30 seconds. In one implementation, the inert gas flow supplied at operation 220 for forming the seed layer 310 is controlled at between 500 sccm and about 6,000 sccm (e.g., between about 2,000 sccm and about 5,000 sccm; between about 3,000 sccm and about 4,000 sccm) for between 2 seconds and about 30 seconds.

During deposition of the seed layer 310, several process parameters may be regulated during the process. In one implementation suitable for processing a 300 mm substrate, the process pressure may be maintained at about 0.1 Torr to about 80 Torr, for example, about 1 Torr to about 20 Torr. In one implementation suitable for processing a 300 mm substrate, the process pressure may be increased during the process, decreased during the process, or cycled between low pressure and high pressure during the process. A RF source power between about 100 Watts and about 1,000 Watts is supplied in the seed layer gas mixture. A RF bias power between about 0 Watts and about 500 Watts may be optionally supplied in the seed layer gas mixture. In one implementation, the RF source power is a high frequency RF source power. In one implementation, the high frequency RF source power is ramped up from 0 Watts at a first predetermined time point "$T_1$," to about 500 Watts at a second predetermined time point "$T_2$." The spacing between the substrate and showerhead may be controlled at about 200 mils to about 1,000 mils. The substrate temperature of the deposition process is maintained between about 300 degrees Celsius and about 900 degrees Celsius, such as between about 400 degrees Celsius and about 480 degrees Celsius. Deposition of the seed layer may be performed with plasma, without plasma, or partially with plasma.

In one implementation, the boron-based precursor gas (shown as the trace line $G_1$ in FIG. 4), such as for example $B_2H_6$, the carbon-based precursor gas (shown as the trace line $G_2$ in FIG. 4), such as for example $C_3H_6$, the optional hydrogen-based precursor gas (shown as the trace line $G_4$ in FIG. 4), the optional inert gases (shown as the trace line $G_5$ in FIG. 4), supplied in the seed layer deposition gas mixture may be supplied at a preset flow rate (e.g., predetermined flow value) from a first predetermined time point "$T_1$" to a second predetermined time point "$T_2$" during the hardmask layer deposition process of FIG. 4. It is noted that the trace line $G_2$ in FIG. 4 depicts that the carbon-based precursor gas is flowed at a rate less than the flow rate of the boron-based precursor gas, such as the trace line $G_1$, as one example. In yet another example, the flow rate of the carbon-based precursor gas, may be supplied at a flow rate greater than the flow rate of the boron-based precursor gas, such as shown by the trace line $G_1$. In the time-period of time zone 1, the gas flow of the boron-based precursor gas, shown as the trace line $G_1$, the carbon-based precursor gas, shown as the trace line $G_2$, the hydrogen-based precursor gas, shown as trace line $G_4$, the inert gas, shown as trace line $G_5$, remain steady when forming the seed layer 310 during operation 220 until the seed layer 310 reaches a predetermined thickness. In one implementation, the seed layer 310 has a thickness between about 50 Å and about 400 Å (between about 100 Å and about 200 Å; or between about 100 Å and about 200 Å).

In one implementation, a chucking voltage is applied to the electrostatic chuck to clamp the substrate 300 to the electrostatic chuck 128. In implementations, where the substrate 300 is positioned on the top surface of the electrostatic chuck 128, the top surface provides support and clamps the substrate 300 during processing. An electrical bias is provided to the substrate 300 via electrode 123, the electrode 123 may be in electronic communication with a power supply system that supplies a biasing voltage to the electrode 123. In one implementation, the chucking voltage is between about 10 volts and about 3,000 volts. In one implementation, the chucking voltage is between about 100 volts and about 2,000 volts. In one implementation, the chucking voltage is between about 200 volts and about 1,000 volts.

Although the gases for deposition of the seed layer 310 in time zone 1 of FIG. 4 are depicted as having steady flow rates, in some implementations, the gas flow rates may be varied during formation of the seed layer 310.

At operation 230, after the seed layer 310 is formed on the film stack 304, a second gas mixture, such as a transition gas mixture, is supplied to the substrate surface. In one implementation, the chucking voltage supplied in operation 220 is maintained during operation 230. The processing gases supplied in the transition gas mixture may be dynamically controlled to facilitate transitioning the seed layer gas mixture to a main deposition gas mixture performed at operation 240 after the supply of the transition gas mixture is completed. After the seed layer 310 has reached to a sought after thickness, in the transition gas mixture, the ratio of the boron-based precursor gas to carbon-based precursor gas may be changed. The transition gas mixture may include at least the ramped down or throttled down carbon-based precursor gas and the continuously steady gas flows of the boron-based precursor gas, the optional hydrogen-based precursor gas, and the inert gases from the seed layer gas mixture from operation 220. In addition to the ramped-down or throttled-down carbon-based precursor gas mixture and the steady flow of the boron-based precursor gas mixture from seed layer gas mixture, a tungsten-based precursor gas is newly introduced in the transition gas mixture at operation 230. Suitable tungsten-based precursor gases include, but are not limited to, $WF_6$, $WC$, $W(CO)_6$ or any suitable tungsten halide gases (such as $WX_n$, where X are halogen species including F, Cl, Br and I and n is integer between 1 and 6), organometallic tungsten precursors, and combinations thereof. In one example, the tungsten-based precursor gas supplied in the transition gas mixture is $WF_6$.

It is noted that the term "ramp-up" as used herein means gradually increasing a process parameter from a first time set point to a second time set point over a predetermined time-period with a sought after ramp-up rate. The term "ramp-up" used herein is not a sudden change caused by an action of throttle or other valve opening and closing.

In operation 230, the gas supply from the seed layer gas mixture at operation 220 (e.g., zone 1 of FIG. 4) is transitioned prior to supplying a main deposition gas mixture at operation 240 (e.g., zone 3 of FIG. 4), which will be described later below. The transition gas mixture as supplied deposits a transition layer 311 on the seed layer 310, as shown in FIG. 3C. The transition layer 311 as formed on the seed layer 310 may have a gradient film structure with a varying atomic concentration with the growth of the transition layer 311. It is believed that the gradual ramp-up of the tungsten-based precursor gas flow and the reduction of the carbon-based precursor gas flow in the transition gas mixture increases the tungsten atomic concentration within the deposited film while reducing the carbon atomic concentration uniformly, thus assisting adherence and distributing the tungsten atoms on the substrate surface to react with the boron atoms (e.g., constantly supplied in the gas mixtures) with desirable film properties and low defect density. Further, it is believed that the gradual ramp-up of the tungsten-based precursor gas flow and the reduction of the carbon-based precursor gas flow in the transition gas mixture may provide a smooth transition, better adhesion and microstructural control. As the tungsten-based precursor gas flow is gradually ramped-up and the carbon-based precursor gas flow is reduced, the transition layer 311 formed on the substrate may be a gradient tungsten boron carbide (WBC) layer with a higher carbon concentration (e.g., lower tungsten concentration) close to the substrate surface and with a lower carbon concentration (e.g., higher tungsten concentration) as the thickness of the transition layer 311 increases. The gases supplied in the transition gas mixture may be dynamically and constantly varied and adjusted to allow the transition layer 311 to provide a smooth transition with different film properties (e.g., from a BC seed layer to a WBC bulk layer later formed in the main deposition process in operation 240). Uniform adherence of the boron, tungsten and carbon atoms with low defect density formed on the substrate surface provides good nucleation sites for the subsequent atoms to nucleate thereon so as to promote a sought after grain structure, grain size and low film roughness. The boron-based precursor gas flow supplied in the transition gas mixture may be kept steady as needed and the ramp-up of the tungsten-based precursor gas as well as the reduction of the carbon-based precursor gas flow to form the transition layer 311 with the sought after gradient film bonding structure in preparation for the main deposition process at operation 240.

When supplying the transition gas mixture into the processing chamber, the tungsten-based precursor gas, shown as the trace line $G_3$, may be gradually ramped up in the time zone 2 from the second predetermined time point "$T_2$" to a third predetermined time point "$T_3$". During the time-period indicated by time zone 2, the flow of the boron-based precursor gas, shown as gas trace line $G_1$ remains steady. During the time-period indicated by time zone 2, the flow of the carbon-based precursor gas, shown as gas trace line $G_2$, is reduced at the second predetermined time point "$T_2$" and remains steady during time zone 2. The flows of the hydrogen-based precursor gas, shown as gas trace line $G_4$, and the inert-based gases, shown as gas trace line $G_5$, may remain steady during time zone 2.

In one implementation, the flow rate of the carbon-based precursor gas supplied at operation 230 may be between about 5 sccm and about 500 sccm as shown in FIG. 4. The ramp-up rate of the tungsten-based precursor gas supplied at operation 230 may be between about 0 sccm and about 500 sccm until the tungsten-based precursor gas supplied to the processing chamber has reached a predetermined gas flow rate at the third predetermined time point "$T_3$". The boron-based precursor gas flow supplied at operation 230 for forming the transition layer 311 is kept at a steady flow rate of between 100 sccm and about 5,000 sccm.

During deposition of the transition layer 311, several process parameters may be regulated the process. In one implementation suitable for processing a 300 mm substrate, the process pressure may be maintained at about 0.1 Torr to about 80 Torr, for example, about 1 Torr to about 20 Torr. A RF source power between about 100 Watts and about 1,500 Watts is supplied in the seed layer gas mixture. In one implementation, the RF source power is a high frequency RF source power. In one implementation, the high frequency RF source power is ramped up from 500 Watts at a second predetermined time point "$T_2$" to about 1,400 Watts at a third predetermined time point "$T_3$." A RF bias power between about 0 Watts and about 500 Watts may be optionally supplied in the transition gas mixture. Deposition of the transition layer may be performed with plasma, without plasma, or partially with plasma. The spacing between the substrate and showerhead may be controlled at about 200 mils to about 1,000 mils. The substrate temperature of the deposition process is maintained between about 300 degrees Celsius and about 900 degrees Celsius, such as between about 480 degrees Celsius.

Figure 3D:
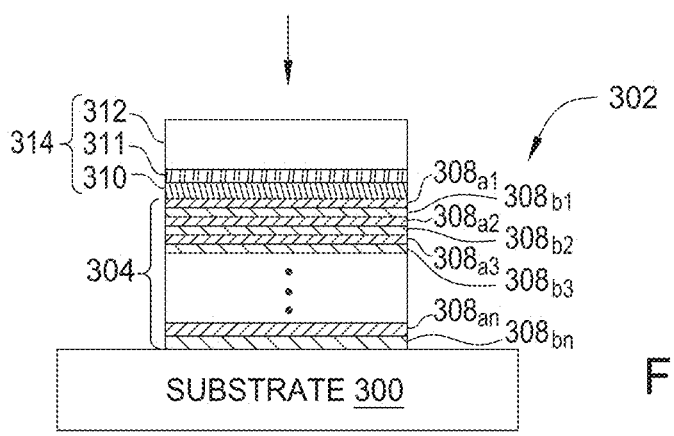

At operation 240, after the flow of transition gas mixture, a third gas mixture, such as a main deposition gas mixture, may be supplied into the processing chamber to form the bulk hardmask layer 312 on the transition layer 311, as shown in FIG. 3D. Thus, an overall hardmask layer 314 formed on the film stack 304 in total includes the seed layer 310, the transition layer 311 and the bulk hardmask layer 312. In some implementations, the gas flow rates of the precursors used to form the bulk hardmask layer 312 are varied during the formation process in order to increase the defect density in the bulk hardmask layer 312. This increased defect density in the bulk hardmask layer increases the amount of fluorine that is trapped in the bulk hardmask layer 312 during deposition of subsequent layers, which promotes interface adhesion to the underlying film stack 304.

As the tungsten-based precursor gas (e.g., the gas trace line $G_3$) has reached a predetermined flow rate when entering into time zone 3 of operation 240, as shown in FIG. 4, the flow rate of the tungsten-based precursor gas controlled for depositing the bulk hardmask layer 312 may be held steady. The flow rates of the boron-based precursor gas (e.g., the gas trace line $G_1$), the carbon-based precursor gas (e.g., the gas trace line $G_2$), the tungsten-based precursor (e.g., the gas trace line $G_3$), the hydrogen-based precursor (e.g., the gas trace line $G_4$), and the inert gases (e.g., the gas trace line $G_5$), may be held steady as the gas mixture switches from the transition gas mixture to the main deposition gas mixture. The main deposition gas mixture may be supplied from the third predetermined time point "$T_3$" to a fourth predetermined time point "$T_4$". In one example, the main deposition process may be performed for between about 10 seconds and about 400 seconds (e.g., between about 100 seconds and about 200 seconds; or between about 100 seconds and about 150 seconds) to form the overall hardmask layer 314. In one implementation, the overall hardmask layer 314 has a thickness between about 20 nm and about 1,000 nm (e.g., between about 300 nm and about 800 nm; or between about 400 nm and about 700 nm).

In one example, the gases supplied in the main deposition gas mixture include at least the tungsten-based precursor gas, the boron-based precursor gas and the carbon-based precursor gas. A hydrogen-based precursor gas may be optionally supplied in the main deposition gas mixture as needed. Inert gases may be optionally supplied in the main deposition gas mixture as needed. In one example, the gases supplied in the main deposition gas mixture include $WF_6$, $B_2H_6$, $C_3H_6$, and $H_2$. In some examples, inert gas, such as Ar or He may also be optionally supplied in the main deposition gas mixture as needed. In such examples, the bulk hardmask layer 312 formed on the film stack 304 is a tungsten boron carbide (WBC) layer.

In some implementations, the bulk hardmask layer 312 is formed at a steady rate to maintain the bulk hardmask layer 312 with low defect density while bridging from the transition layer 311. In one implementation, the tungsten-based precursor gas supplied at operation 240 for forming the bulk hardmask layer 312 is controlled at between about 50 sccm and about 500 sccm. In one implementation, the carbon-based precursor gas flow supplied at operation 240 for forming the bulk hardmask layer 312 is controlled at between 10 sccm and about 1,000 sccm. In one implementation, the boron-based precursor gas flow supplied at operation 240 for forming the bulk hardmask layer 312 is controlled at between 100 sccm and about 5,000 sccm. In one implementation, the hydrogen-based precursor gas flow supplied at operation 240 for forming the bulk hardmask layer 312 is controlled at between 1,000 sccm and about 5,000 sccm. In one implementation, the inert gas flow supplied at operation 240 for forming the bulk hardmask layer 312 is controlled at between 500 sccm and about 6,000 sccm.

During deposition of the bulk hardmask layer 312, several process parameters may be regulated. In one implementation suitable for processing a 300 mm substrate, the process pressure may be maintained at about 0.1 Torr to about 80 Torr, for example, about 1 Torr to about 20 Torr. A RF source power between about 1,000 Watts and about 2,000 Watts is supplied in the main deposition gas mixture. In one implementation, the RF source power is a high frequency RF source power. In one implementation, the high frequency RF source power is maintained at about 1,400 Watts from the third predetermined time point "$T_3$" to the fourth predetermined time point "$T_4$." A RF bias power between about 0 Watts and about 500 Watts may be optionally supplied in the main deposition gas mixture. Deposition of the bulk hardmask layer may be performed with plasma, without plasma, or partially with plasma. The spacing between the substrate and showerhead may be controlled at about 200 mils to about 1,000 mils. The substrate temperature of the deposition process is maintained between about 300 degrees Celsius and about 900 degrees Celsius, such as between about 400 degrees Celsius and about 480 degrees Celsius.

It is noted that the stress level of the bulk hardmask layer 312 may be adjusted by adjusting the RF bias power supplied during the main deposition process at operation 240. When the RF bias power is supplied at a higher level, a more compressive film of the bulk hardmask layer 312 may be obtained. In contrast, the RF bias power is supplied at a lower level, a more tensile film of the bulk hardmask layer 312 may be obtained.

In some implementations, the stress level of the overall hardmask layer 314 may be adjusted by the application of LFRF power. In one implementation, the film stress can be tuned by the application of 350 Watts LF (350 kHz) in the presence of argon gas, wherein the argon gas ions bombard the film and effectively reduce the stress of the film. The LFRF power may be applied during formation of the transition layer 311, the bulk hardmask layer 312, or both the transition layer 311 and the bulk hardmask layer 312.

In one example, the overall hardmask layer 314 (including the seed layer 310, the transition layer 311 and the bulk hardmask layer 312) may be in combination having a stress range between about −100 MPa and about +1000 MPa. It is believed that the seed layer 310 and the transition layer 311 formed in the overall hardmask layer 314 may assist providing a smooth film structure transition as well as providing a good adhesion to the substrate surface. The smooth film structure transition (e.g., predominately contributed from the transition layer 311) formed in the overall hardmask layer 314 may assist maintaining the overall hardmask layer 314 with minimum surface roughness, such as a surface roughness less than 2 nm Ra. Furthermore, grain sizes of the overall hardmask layer 314 may also be controlled, such as grain sizes less than 16 Å, to provide a good etching selectivity to serve as a mask layer during an etching/patterning process.

After the overall hardmask layer 314 is formed on the substrate, the substrate is de-chucked. The chucking voltage is turned-off. The reactive gases are turned-off and optionally purged from the processing chamber. In one implementation, during operation RF power is reduced (e.g., ~200 W). Optionally, the system controller 175 monitors impedance change to determine whether electrostatic charges are dissipated to ground through the RF path. Once the substrate is de-chucked from the electrostatic chuck, the remaining gases are purged from the processing chamber. The processing chamber is pumped down and the substrate is moved up on the lift pins and transferred out of chamber.

After the overall hardmask layer 314 is formed on the substrate, the overall hardmask layer 314 may be utilized in an etching process as a patterning mask to form a three-dimensional structure, such as a stair like structure.

The overall hardmask layer 314 may be patterned using a standard photoresist patterning techniques. A patterned photoresist (not shown) may be formed over the overall hardmask layer 314. The overall hardmask layer 314 may be etched in a pattern corresponding with the patterned photoresist layer followed by etching the pattern into the substrate. Material may be deposited into the etched portions of the substrate. The overall hardmask layer 314 may be removed using a solution comprising hydrogen peroxide and sulfuric acid. One exemplary solution comprising hydrogen peroxide and sulfuric acid is known as Piranha solution or Piranha etch. The overall hardmask layer 314 may also be removed using etch chemistries containing oxygen and halogens (e.g. fluorine or chlorine), for example, $Cl_2/O_2$, $CF_4/O_2$, $Cl_2/O_2/CF_4$. The overall hardmask layer 314 may be removed by a chemical mechanical polishing (CMP) process.

EXAMPLES

The following non-limiting examples are provided to further illustrate implementations described herein. However, the examples are not intended to be all-inclusive and are not intended to limit the scope of the implementations described herein. In one example, a tungsten boron carbide hardmask film was fabricated by using $WF_6+C_3H_6+B_2H_6+H_2$ at 400 degrees Celsius and 1400 W RF (13.56 MHz) power in a PECVD reactor with Ar and He as diluting gases and a boron carbide (e.g., $B_2H_6$ & $C_3H_6$) glue layer for adhesion and transition ramp. In one example, the tungsten boron carbide hardmask film had a composition of 72 at. % tungsten, 8 at. % boron, and 20 at. % carbon. In another example, the tungsten boron carbide hardmask film had a composition of 60 at. % tungsten, 20 at. % boron, and 20 at. % carbon. A seed layer of amorphous boron carbide was deposited by flowing $B_2H_6$, $H_2$ and $C_3H_6$ with 500 Watts HFRF power prior to the main deposition. The seed layer deposition was followed by a transition/ramp layer, wherein the $WF_6$ flow is ramped up along with a ramp of HFRF from about 500 Watts to about 1400 Watts. This ramp layer helps with film adhesion. The film stress can be tuned by the use 350 Watts LFRF (e.g., 350 kHz), wherein the argon diluent gas ions bombard the film and effectively reduce the stress of the film. The LFRF power can be adjusted to independently tune the stress without affecting other parameters such as deposition rate, roughness, and adhesion.

Figure 5B:
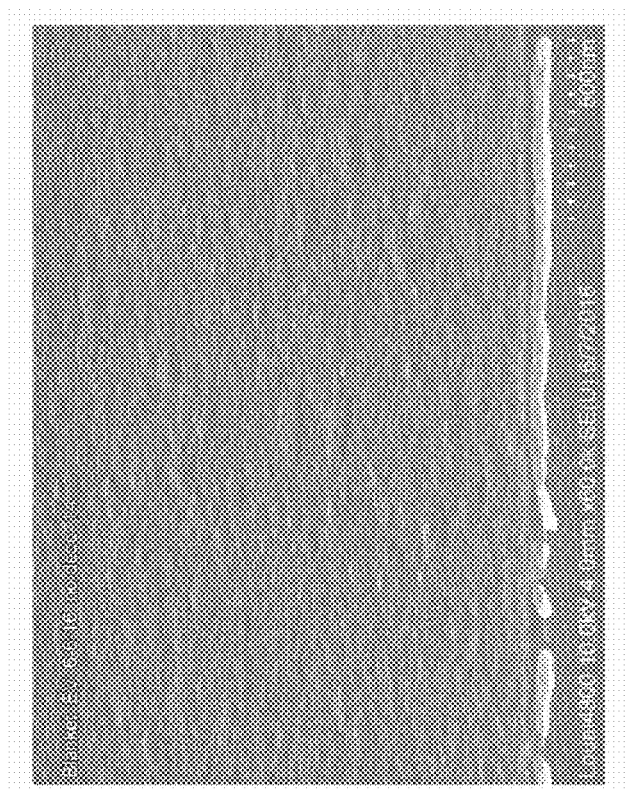
FIGS. 5A and 5B depict scanning electron micrograph (SEM) photos of a tungsten boron carbide hardmask layer formed in accordance with one or more implementations of the present disclosure.
Figure 5A:
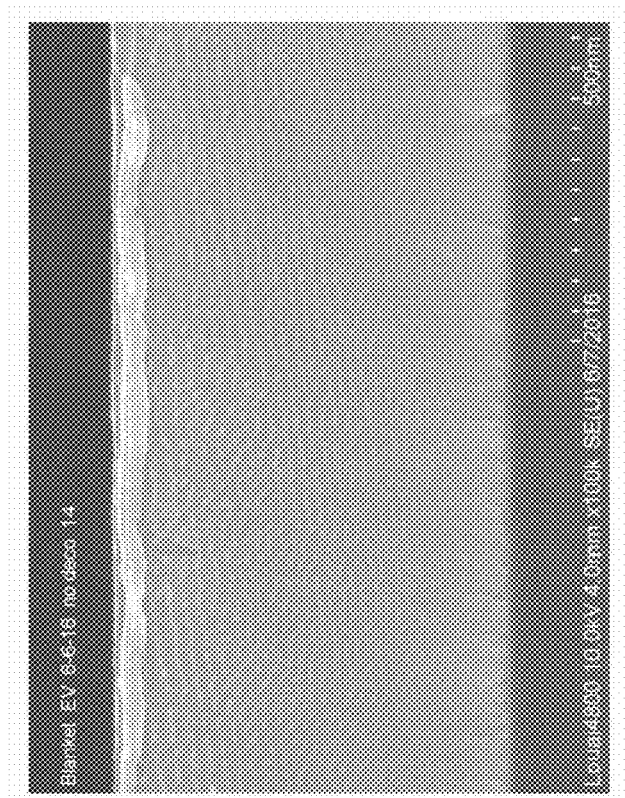

FIG. 5A depicts a scanning electron micrograph (SEM) photo of a cross-section of a tungsten boron carbide hardmask layer formed in accordance with one or more implementations of the present disclosure. FIG. 5B depicts a scanning electron micrograph (SEM) photo of a tilt-view of a tungsten boron carbide hardmask layer formed in accordance with one or more implementations of the present disclosure. The tungsten boron carbide hardmask layer includes 72 at. % tungsten, 8 at. % boron, and 20 at. % carbon.

Figure 6:
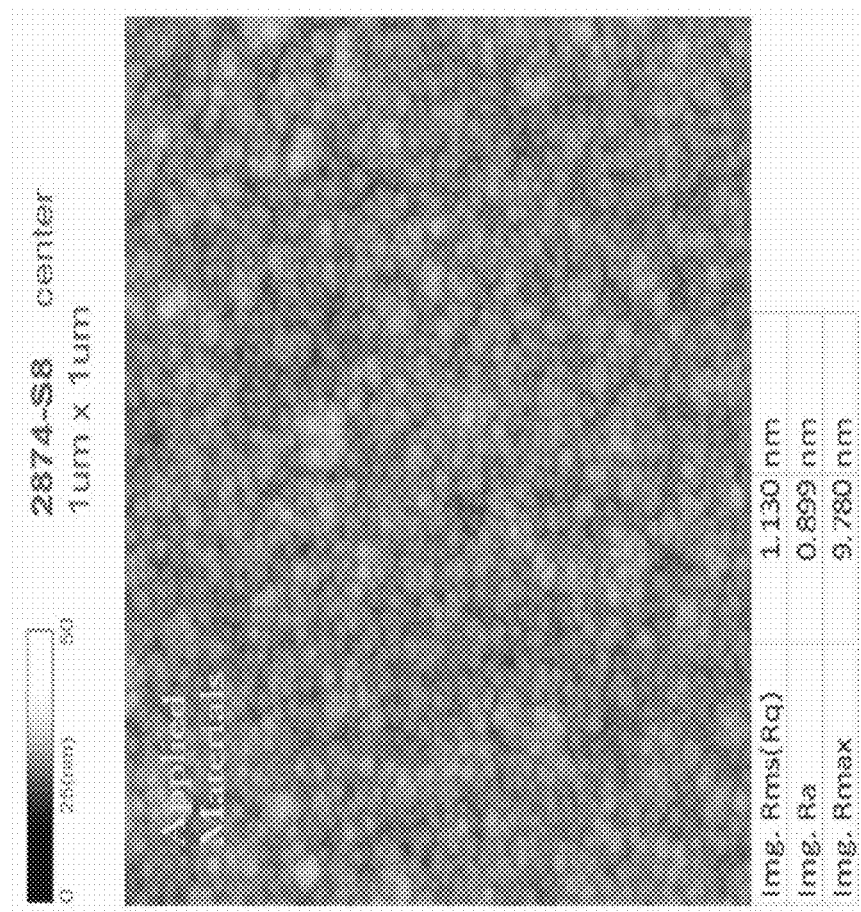
FIG. 6 is a scanning electron micrograph (SEM) photo demonstrating the roughness of a 1,000 Å film on oxide formed in accordance with one or more implementations of the present disclosure.

FIG. 6 is a scanning electron micrograph (SEM) photo demonstrating the roughness of a 1,000 Å tungsten boron carbide film formed on oxide in accordance with one or more implementations of the present disclosure. The tungsten boron carbide hardmask layer includes 72 atomic % tungsten, 8 atomic % boron, and 20 atomic % carbon. The tungsten boron carbide film demonstrated an Image Rms (Rq) of 1.130 nanometers, an Image Ra of 0.899 nanometers, and an Image Rmax of 9.780 nanometers.

Figure 7:
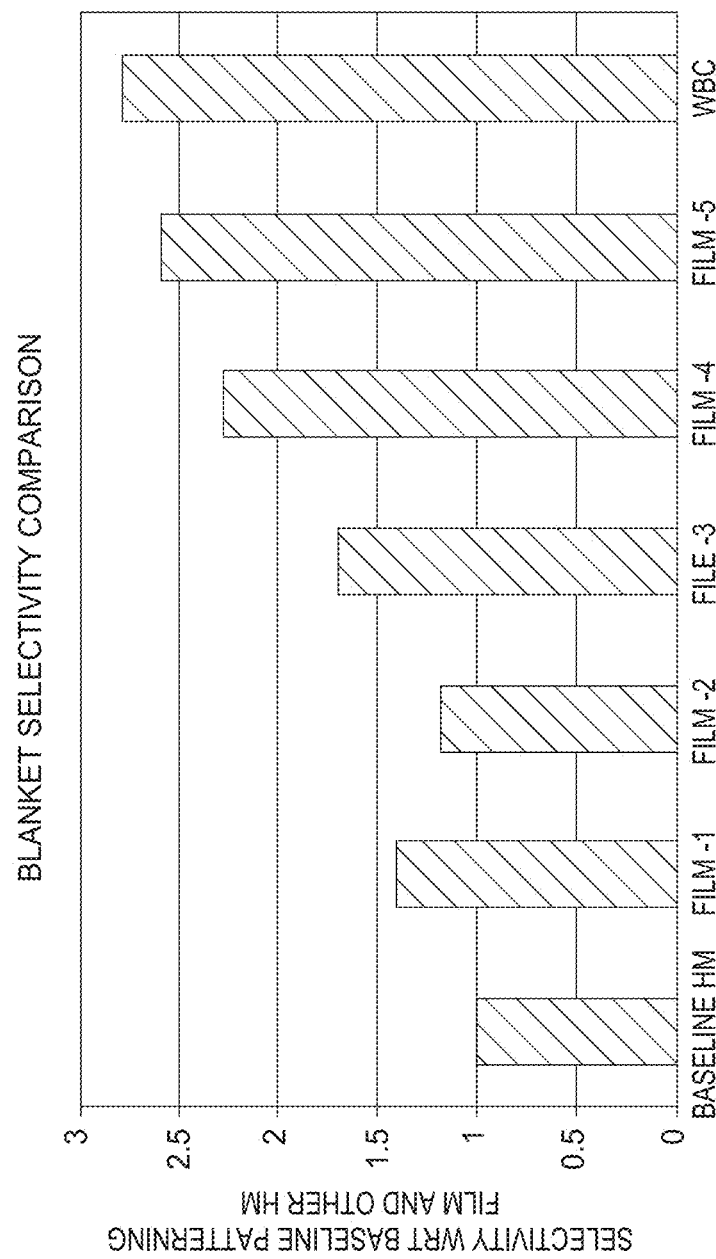
FIG. 7 is a plot demonstrating the etch selectivity of a tungsten boron carbide hardmask layer formed according to implementations described herein with the etch selectivity of other prior art hardmask layers.

FIG. 7 is a plot demonstrating the etch selectivity of a tungsten boron carbide blanket film formed according to implementations described herein with the etch selectivity of other prior art hardmask films.

In summary, some of the benefits of the present disclosure provide a process for forming a tungsten boron carbide hardmask layer that may be utilized for manufacturing semiconductor devices. The hardmask layer may include a seed layer, transition layer and a bulk hardmask layer that provide a bonding structure with low surface roughness and high adhesion at the interface. In some implementations, the tungsten boron carbide hardmask layer has a smaller grain size and greater etch selectivity relative to other hardmask films and pattern etch selectivity approaching that of pure tungsten, while avoiding the grain size and roughness issue associate with other metallic hardmasks. The tungsten boron carbide hardmask layer with desired robust film properties and etching selectivity, an improved dimension and profile control of the resultant structures formed in a film stack may be obtained and the electrical performance of the chip devices may be enhanced in applications for three-dimensional stacking of semiconductor devices.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further embodiments of the present disclosure may be devised without departing from the basic scope thereof, and the scope thereof is determined by the claims that follow.

The invention claimed is:

1. A method of forming a hardmask layer on a substrate comprising:
   forming a seed layer on a substrate by supplying a seed layer gas mixture in a processing chamber;
   forming a transition layer comprising tungsten, boron and carbon on the seed layer by supplying a transition layer gas mixture in the processing chamber; and
   forming a bulk hardmask layer comprising tungsten, boron and carbon on the transition layer by supplying a main deposition gas mixture in the processing chamber.

2. The method of claim 1, wherein the transition layer gas mixture comprises at least a boron-based precursor gas, a carbon-based precursor gas and a tungsten-based precursor gas.

3. The method of claim 2, wherein the main deposition gas mixture comprises the boron-based precursor gas, the carbon-based precursor gas and the tungsten-based precursor gas.

4. The method of claim 3, wherein the seed layer gas mixture comprises at least the boron-based precursor gas and the carbon-based precursor gas.

5. The method of claim 3, wherein the boron-based precursor gas is $B_2H_6$, the carbon-based precursor gas is $C_3H_6$, and the tungsten-based precursor gas is $WF_6$.

6. The method of claim 2, wherein the transition layer gas mixture is supplied to the processing chamber by reducing a gas flow rate of the carbon-based precursor gas while maintaining a steady gas flow rate of the boron-based precursor gas.

7. The method of claim 6, wherein the transition layer gas mixture is supplied to the processing chamber by ramping up a gas flow rate of the tungsten-based precursor gas.

8. The method of claim 7, wherein the main deposition gas mixture is supplied to the processing chamber by steadily supplying the boron-based precursor gas, the carbon-based precursor gas, and the tungsten-based precursor gas.

9. The method of claim 8, further comprising supplying a hydrogen-based precursor gas into the processing chamber while forming the seed layer, forming the transition layer, and forming the bulk hardmask layer.

10. The method of claim 9, wherein supplying the hydrogen-based precursor gas into the processing chamber comprises steadily supplying the hydrogen-based precursor gas into the processing chamber.

11. The method of claim 1, further comprising:
    ramping a high frequency RF power while forming the seed layer and forming the transition layer; and
    steadily supplying the high frequency RF power while forming the bulk hardmask layer.

12. The method of claim 1, further comprising supplying a low frequency RF power while forming the transition layer and forming the bulk hardmask layer.

13. The method of claim 12, further comprising applying a bias to the substrate while supplying the low frequency RF power.

14. The method of claim 1, wherein the seed layer is selected from a boron carbide (BC) seed layer, a boron nitride (BN) seed layer, a boron carbon nitride (BCN) seed layer, a carbon nitride (CN) seed layer, a silicon carbide (SiC) seed layer, a silicon nitride (SiN) seed layer, a boron-based seed layer, a carbon seed layer, a titanium nitride (TiN) seed layer, or a tungsten silicide (WSi) seed layer.

15. A method of forming a hardmask layer comprising:
    supplying a gas mixture including at least a boron-based precursor gas and a carbon-based precursor gas onto a surface of a substrate disposed in a processing chamber to form a seed layer on the substrate;
    ramping down the carbon-based precursor gas and ramping up a tungsten-based precursor gas supplied in the gas mixture while maintaining a steady flow of the boron-based precursor gas into the processing chamber to form a transition layer on the seed layer; and
    continuously supplying the tungsten-based precursor gas in the gas mixture until the tungsten-based precursor gas reaches a predetermined flow rate and maintaining the tungsten-based precursor gas at a steady predetermined flow rate to form a bulk hardmask layer.

16. The method of claim 15, wherein the seed layer is a boron carbide layer, the transition layer is a gradient tungsten boron carbide layer, and the bulk hardmask layer is a tungsten boron carbide layer.

17. The method of claim 15, further comprising:
    ramping a high frequency RF power while forming the seed layer and forming the transition layer; and
    steadily supplying the high frequency RF power while forming the bulk hardmask layer.

18. A hardmask layer, comprising:
    a seed layer, a transition layer and a bulk hardmask layer disposed on the transition layer, wherein the seed layer is a boron carbide layer, the transition layer is a gradient tungsten boron carbide layer and the bulk hardmask layer is a tungsten boron carbide layer.

19. The hardmask layer of claim 18, wherein the hardmask layer comprises from about 50 to about 70 atomic percentage of tungsten, from about 10 to about 30 atomic percentage of carbon, and from about 10 to about 20 atomic percentage of boron.

20. The hardmask layer of claim 18, wherein the hardmask layer has a gradient film structure.

* * * * *